United States Patent [19]
Iwasaki et al.

[11] Patent Number: 5,623,417
[45] Date of Patent: Apr. 22, 1997

[54] METHOD AND APPARATUS FOR FUNCTIONAL LEVEL DATA INTERFACE

[75] Inventors: Chie Iwasaki, Osaka; Michiaki Muraoka, Nara, both of Japan

[73] Assignee: Matsushita Electric Industrial Co., Ltd., Kadoma, Japan

[21] Appl. No.: 294,393

[22] Filed: Aug. 23, 1994

[30] Foreign Application Priority Data

Aug. 24, 1993 [JP] Japan ................................. 5-209323

[51] Int. Cl.⁶ ................................................. G06F 17/50
[52] U.S. Cl. ........................... 364/488; 364/489; 364/490
[58] Field of Search ................................. 364/488, 489, 364/490, 491, 578

[56] References Cited

U.S. PATENT DOCUMENTS

| | | | |
|---|---|---|---|
| 4,831,543 | 5/1989 | Mastellone | 364/489 |
| 4,833,619 | 5/1989 | Shimizu et al. | 364/489 |
| 4,896,272 | 1/1990 | Kurosawa | 364/491 |
| 4,922,432 | 5/1990 | Kobayashi et al. | 364/490 |
| 5,119,314 | 6/1992 | Hotta et al. | 364/491 |
| 5,212,650 | 5/1993 | Hooper et al. | 364/489 |
| 5,224,055 | 6/1993 | Grundy et al. | 364/488 |
| 5,274,793 | 12/1993 | Kuroda et al. | 364/489 |
| 5,278,769 | 1/1994 | Bair et al. | 364/488 |
| 5,282,146 | 1/1994 | Aihara et al. | 364/489 |
| 5,287,289 | 2/1994 | Kageyama et al. | 364/489 |
| 5,303,161 | 4/1994 | Burns et al. | 364/490 |
| 5,311,442 | 5/1994 | Fukushima | 364/488 |
| 5,325,309 | 6/1994 | Halaviato et al. | 364/489 |
| 5,345,393 | 9/1994 | Ueda | 364/489 |
| 5,367,468 | 11/1994 | Fukasawa et al. | 364/490 |
| 5,371,683 | 12/1994 | Fukazawa et al. | 364/489 |
| 5,384,710 | 1/1995 | Lam et al. | 364/489 |
| 5,416,721 | 5/1995 | Nishiyama et al. | 364/491 |
| 5,432,707 | 7/1995 | Leung | 364/489 |
| 5,438,524 | 8/1995 | Komoda | 364/489 |
| 5,452,230 | 9/1995 | Morio et al. | 364/489 |
| 5,504,690 | 2/1996 | Kobayashi et al. | 364/489 |
| 5,519,627 | 5/1996 | Mahmood et al. | 364/488 |

*Primary Examiner*—Kevin J. Teska
*Assistant Examiner*—Tyrone V. Walker
*Attorney, Agent, or Firm*—McDermott, Will & Emery

[57] ABSTRACT

The functional design of logical circuits is represented using different types of functional components. The unification of the database and the interface permits the unification of functional design automation tools. These functional components are a data transfer component, an external pin component, a register component, a terminal component, a constant component, a function component, a memory component, a submodule component, a state machine component, and a logical expression component. An HDL (Hardware Description Language) file containing functional operation descriptions or functional design data is input, and the input functional data is assigned to each functional component stored in a functional component library through a functional component assignment process. The functional data records assigned by functional component are written into a function database by means of corresponding write sections provided in a functional data input interface. The functional data records stored in the function database are read out through corresponding read sections provided in a functional data output interface, whereby arbitrary design tool data is generated at a function level by means of a functional data generation process.

6 Claims, 14 Drawing Sheets

```
1   module top(IDATA,MODE,CLK,RST,ODATA,ZERO);
2   input [3:0]      IDATA;
3   input            MODE,CLK,RST;
4   output [3:0]     ODATA;
5   output           ZERO;
6   reg [3:0]        ODATA;
7   reg              ZERO;
8   reg [3:0]        MAR,R0,R1,R2;
9   reg [3:0]        BUS,AIN;
10  reg              MAR_INC, R0_WE,R1_WE, R2_WE,
11                   IN_DATA, ROM_RE, BOX_OUT, OUT_DATA,MODE0, MODE1;
12  wire [3:0]       BOXOUT, ROMOUT;
13  parameter [1:0]
14          S0 = 2'd0, S1 = 2'd1, S2 = 2'd2, S3 = 2'd3;
15  reg [1:0]        FSM; / state machine name is FSM /
16  reg [1:0]        FSM_next;
17  ROM              INROM( .ADDRESS(MAR),.DOUT(ROMOUT),.RE(ROM_RE) );
18  SUBMODULE        BOX( .A(AIN),.B(BUS),.Y(BOXOUT) );
19  always @ (posedge CLK or posedge RST) begin
20          if( RST )         MAR = 4'd0;
21          else if( MAR_INC)     MAR = MAR + 1'b1;
22  end
23  always @ (posedge CLK or posedge RST) begin
24          if( RST )         R0 = 4'd0;
25          else if( R0_WE )      R0 = BUS;
26  end
27  always @ (posedge CLK or posedge RST) begin
28          if( RST )         R1 = 4'd0;
29          else if( R1_WE )      R1 = BUS;
30  end
31  always @ (posedge CLK or posedge RST) begin
32          if( RST )         R2 = 4'd0;
33          else if( R2_WE)       R2 = BOXOUT;
34  end
35  always @ ( IDATA or IN_DATA or ROMOUT or ROM_RE or R2 or BOX_OUT ) begin
36          case (1)
37                  IN_DATA: BUS = IDATA;
```

FIG. 6A

```
38              ROM_RE: BUS = ROMOUT;
39              BOX_OUT: BUS = R2;
40              default: BUS = 4'bx;
41          endcase
42  end
43  always @ ( R0 or R1 or MODE ) begin
44          case (I)
45              MODE0: AIN = R0;
46              MODE1: AIN = R1;
47              default: AIN = 4'bz;
48          endcase
49  end
50  always @ ( BUS or OUT_DATA ) begin
51          if( OUT_DATA )           ODATA = BUS;
52  end
53
54  always @ ( R2 ) begin
55          ZERO = ( R2 == 4'd0 )
56  end
57  always @ ( MODE ) begin
58          MODE0 = (MODE == 0);
59          MODE1 = (MODE == 1);
60  end
61
62  always @ (FSM ) begin
63          MAR_INC = 1'b0;
64          R0_WE = 1'b0;
65          R1_WE = 1'b0;
66          R2_WE = 1'b0;
67          IN_DATA = 1'b0;
68          ROM_RE = 1'b0;
69          BOX_OUT = 1'b0;
70          OUT_DATA = 1'b0;
71          case (FSM)
72                  S0:     begin
73                                  FSM_next = S1;
74                                  IN_DATA = 1'b1;
```

FIG. 6B

```
75                              R0_ WE = 1'b1;
76                          end
77          S1:     begin
78                              FSM_next = S2;
79                              ROM_RE = 1'b1;
80                              MAR_INC = 1'b1;
81                              R1_WE = 1'b1;
82                          end
83          S2:     begin
84                              FSM_next = S3;
85                              ROM_RE = 1'b1;
86                              MAR_INC = 1'b1;
87                              R2_WE = 1'b1;
88                          end
89          S3:     begin
90                              FSM_next = S0;
91                              BOX_OUT = 1'b1;
92                              OUT_DATA = 1'b1;
93                          end
94          endcase
95  end
96  always @ (posedge CLK or posedge RST) begin
97          if( RST )       FSM = S0;
98          else            FSM = FSM_next;
99  end
100 endmodule
101
102 module ROM(ADDRESS, DOUT, RE)
103 input           [3:0]   ADDRESS;
104 input                   RE;
105 output          [3:0]   DOUT
106 reg     [3:0]   mem[15:0]
107 always @ (RE) begin
108         if(RE == 1)     DOUT = mem[ADDRESS];
109 end
110 endmodule
```

memory(INROM,ROM,4,16,ROM,ROMRE):

FIG. 8 (b)

submodule(BOX,SUBMODULE):

FIG. 8 (c)

```
1  fsm(FSM,2,4,0,8);
2  fsm_clock(CLK,rise,alone);
3  fsm_reset(RST,asynchro,S0);
4  state_code(S0,0);
5  state_code(S1,1);
6  state_code(S2,2);
7  state_code(S3,3);
8  fsm_pin(MAR_INC,o,0);
9  fsm_pin(R0_WE,o,1);
10 fsm_pin(R1_WE,o,2);
11 fsm_pin(R2_WE,o,3);
12 fsm_pin(IN_DATA,o,4);
13 fsm_pin(ROM_RE,o,5);
14 fsm_pin(BOX_DATA,o,6);
15 fsm_pin(OUT_DATA,o,7);
16 state_transfer(S0,S1,,FSM_0_1);
17 state_transfer(S1,S2,,FSM_0_2);
18 state_transfer(S2,S3,,FSM_0_3);
19 state_transfer(S3,S0,,FSM_0_4);
20 output_code(FSM_0_0,01001000);
21 output_code(FSM_0_1,10100100);
22 output_code(FSM_0_2,10010100);
23 output_code(FSM_0_3,00000011);
```

FIG. 8 (d)

expression(MODE0,MODE==0):
expression(MODE1,MODE==1):

FIG. 9 (a)
```
external_pin(IDATA,4,input,);
external_pin(MODE,1,input);
external_pin(CLK,1,clock);
external_pin(RST,1,reset);
external_pin(ODATA,4,output);
external_pin(ZERO,1,output);
```

FIG. 9 (b)
```
terminal(BUS,4,mux);
terminal(AIN,4,bus);
terminal(ROMOUT,4,term);
terminal(BOXOUT,4,term);
```

FIG. 9 (c)
```
register(R0,4,CLK,rise,RST,asynchro,1);
register(R1,4,CLK,rise,RST,asynchro,1);
register(R2,4,CLK,rise,RST,asynchro,1);
register(MAR,4,CLK,rise,RST,asynchro,1);
```

FIG. 9 (d)
```
function(func1,INCREMENT,4);
function(func2,==,4);
```

FIG. 9 (e)
```
constant(const1,4,0);
```

FIG. 9 (f)
```
1  data_transfer(MAR,,INROM,ADDRESS,);
2  data_transfer(INROM,DOUT,ROMOUT,,);
3  data_transfer(AIN,,BOX,A,);
4  data_transfer(BUS,,BOX,B,);
5  data_transfer(BOX,Y,BOXOUT,,);
6  data_transfer(MAR,,func1,a,);
7  data_transfer(func1,y,MAR,,MAR_INC);
8  data_transfer(BUS,,R0,,R0_WE);
9  data_transfer(BUS,,R1,,R1_WE);
10 data_transfer(BOXOUT,,R2,,R2_WE);
11 data_transfer(IDATA,,BUS,,IN_DATA);
12 data_transfer(ROMOUT,,BUS,,ROM_RE);
13 data_transfer(R2,,BUS,,BOX_OUT);
14 data_transfer(R0,,AIN,,MODE0);
15 data_transfer(R1,,AIN,,MODE1);
16 data_transfer(BUS,,ODATA,,OUT_DATA);
17 data_transfer(R2,,func2,a,);
18 data_transfer(const1,,func2,b,,);
19 data_transfer(func2,y,ZERO,,);
```

FIG. 12 (a)
```
module top(CLK,MODE,RST,IDATA,ZERO,ODATA);
input    CLK,MODE,RST;
input    [3:0] IDATA;
output   ZERO;
output   [3:0] ODATA;
```

FIG. 12 (b)
```
reg    ZERO;
reg    [3:0] ODATA;
reg    [3:0] MAR,R0,R1,R2;
reg    [3:0]AIN,BOXOUT,BUS,ROMOUT;
reg    BOX_OUT,IN_DATA,MAR_INC,MODE0,MODE1,OUT_DATA
       ,R0_WE,R1_WE,R2_WE,ROM_RE;
```

FIG. 12 (c)
```
parameter [1:0]
         S0 = 2'd0,
         S1 = 2'd1,
         S2 = 2'd2,
         S3 = 2'd3;
reg [1:0] FSM;
reg [1:0] FSM_next;
```

FIG. 12 (d)
```
wire   [3:0] INROM_DOUT;
ROM    INROM(.ADDRESS(MAR),.DOUT(INROM_DOUT),.RE(ROMRE));
```

FIG. 12 (e)
```
wire   [3:0] BOX_y;
SUBMODULE BOX (.a(AIN),.b(BUS),.y(BOX_y));
```

FIG. 12 (f)
```
function [3:0] func1;
         input [3:0] a;
         reg  [3:0] y;
         begin
             y = a + 1;
             func1 = y;
         end
endfunction
```

FIG. 12 (g)
```
always @ (OUT_DATA or BUS) begin
         if(OUT_DATA) ODATA = BUS;
end
```

FIG. 13(a)
```
always @ (BOX_OUT or IDATA or IN_DATA or R2 or ROMOUT or ROM_RE)
begin
        case(1)
            IN_DATA : BUS = IDATA;
            ROM_RE : BUS = ROMOUT;
            BOX_OUT : BUS = R2;
            default : BUS = 4'bx;
        endcase
end
```

FIG. 13(b)
```
always @ (posedge CLK or posedge RST) begin
        if(RST)
            MAR = 4'd0;
        else
            case(1)
                MAR_INC: MAR = func1(MAR);
            endcase
end
```

FIG. 13(c)
```
always @ (MODE)
begin
        MODE0 = (MODE == 0);
end
always @(MODE)
begin
        MODE2 = (MODE == 1);
end
```

FIG. 13(d)
```
always @ (FSM)
begin
        MAR_INC = (FSM ==S1 | FSM ==S2);
end
always @(FSM)
begin
        RO_WE = (FSM ==S0);
end
```

FIG. 13(e)
```
always @ (FSM) begin
        case (FSM)
            S0:   FSM_next = S1;
            S1:   FSM_next = S2;
            S2:   FSM_next = S3;
            S3:   FSM_next = S0;
        endcase
end
always @(posedge CLK or posedge RST) begin
        if(RST)
            FSM = S0;
        else
            FSM = FSM_next;
end
```

METHOD AND APPARATUS FOR FUNCTIONAL LEVEL DATA INTERFACE

BACKGROUND OF THE INVENTION

This invention is directed to a functional data interface method and apparatus for manipulating the storage and retrieval of functional data of a logical circuit into and out of a function database.

Because of the rapid progress in IC integration scale, automated design techniques covering from logical design to layout design have been widely applied, and the standardization of data representations at net list levels and data interface methods is in progress (see "CFI Design Representation Programming Interface").

Meanwhile, functional design automation at higher conceptual. levels (e.g., register transfer level) is also in intensive research with its main themes:

(1) DATA PATH SYNTHESIS
(2) CONTROL SYNTHESIS
(3) PERFORMANCE ESTIMATION
(4) CIRCUIT PARTITION
  (e.g., STATE MACHINE PARTITION and DATA PATH PARTITION)

One of the usual functional data interface techniques is now described. In such a technique, a file of data records described by means of a hardware description language (HDL) is input so as to create internal data, otherwise an HDL file is created from internal data and the created HDL file is output. For instance, a tool, which inputs graphic forms to perform functional design, generates an HDL description from an input graphic form. Such a generated HDL description (i.e., functional design data) is forwarded to another tool such as a logical synthesizer and simulator.

In the above-mentioned functional data interface technique, each tool serves as an interface between an HDL description and internal data. If tools vary to many types, this produces the following drawbacks:

(i) If changes in the HDL specification (representation format) are made, this gives rise to revisions to individual tools. As the number of tools increases, high-speed processing becomes more difficult.

(ii) Each tool has its own data representation format and database. The difficulty comes in unifying a system containing plural tools in order that the system has a single common data representation format and a single common database.

(iii) For the case of (ii), it can be taken to use a particular one of databases of plural tools within the system to make it serve as a common database. This, however, results in creating an environment where different representation formats concurrently exist in such a common database. As a result, data communication from the common data base to a specific tool becomes complicated. Further, an unwanted case where there is a sufficient quantity of data with respect to a tool whose database is selected as a common database while another tool lacks in data may occur. This prevents that common database from working as a common database.

SUMMARY OF THE INVENTION

It is an object of the present invention to provide an improved functional data interface method and apparatus whereby (a) databases are unified, (b) a functional design, described by an HDL or represented in a graphic form representation, is data-converted to suit the unified database, and (c) arbitrary data for functional design automation tools is generated from the unified database.

It is another object of the present invention to provide a technique capable of timely handling changes in the HDL specification and changes in the database specification with less revision involved.

It is still another object of the present invention to provide a technique capable of providing flexibility to description language changes (e.g., a change from an HDL to another language) with less revision involved.

In accordance with the present invention, each functional design automation tool does not serve as an interface. Instead, an input interface section and an output interface section are provided. With the help of these interface sections, functional data records are stored in the database by functional component.

The present invention discloses a functional data interface method for use in a functional design support apparatus having (i) a function database to store functional information of a logical circuit made up of data paths, state machines, logical expressions, memories and submodules and (ii) a functional component library, the functional data interface method comprising:

a functional data input process step of inputting either a file described in a hardware description language or functional data represented in a functional diagram representation, a state transition diagram representation, and a logical expression representation;

a functional component assignment process step of assigning said functional data to each functional component of the functional component library;

a functional data storage process step of storing the assigned functional data into the function database by functional component;

a functional data read process step of reading the functional data stored in the function database by functional component; and a functional data generation process step of generating arbitrary design tool data at a function level from the functional data read by the functional data read process step.

The present invention discloses a functional data interface apparatus for use in a functional design support apparatus having (i) a function database to store functional information of a logical circuit made up of data paths, state machines, logical expressions, memories and submodules and (ii) a functional component library, the functional data interface apparatus comprising:

a functional data input section for inputting either a file described in a hardware description language or functional data represented in a functional diagram representation, a state transition diagram representation, and a logical expression representation;

a functional data memory for storing the functional data;

a central processing unit (CPU) for assigning the functional data stored into the functional data memory to functional components of the functional library and generating arbitrary design tool data at a function level from the functional data assigned to the functional components;

a functional data input interface for moving the functional data assigned by the CPU by functional component to the function database; and a functional data output interface for moving the functional data from the function database to the CPU by functional component.

In the functional data input process, an HDL file is brought in. In the functional component assignment process, a functional design described by an HDL or represented in a graphic form representation is assigned to ten types of functional components stored in the functional component library. namely a state machine functional component, a logical expression functional component, a memory functional component, a submodule functional component, an external pin functional component, a terminal functional component, a register functional component, a function functional component, a constant functional component, and a data transfer relationship functional component. The functional data input interface has write sections for the respective functional components. The functional data storage process has representation formats by functional component. The functional data output interface has read sections for the respective functional components. In the functional data storage process, each data assigned by functional component is stored in the function database through the function data input interface. In the function data read process, the data stored in the function database is read by functional component through the function data output interface. In the function data generation process, arbitrary data for tools at a function level is generated.

As a result of such an arrangement, the occurrence of changes in the HDL specification can be handled by revising only a functional data input section according to a change made. The present invention is able to deal with HDL specification change faster than usual techniques, since the usual technique requires revision for every tool if there is made a change in the HDL specification.

Also, the occurrence of changes in the function database specification can be handled speedy by revising only portions in relation to a specific functional component to which change is made.

Function data records are stored in the function database by functional component. In the functional data generation process, selection from among the read processes of the functional data output interface process is made thereby facilitating the extraction of required information from the function database. As a result of such arrangement, a common database to be shared among plural tools within a single system can be realized.

BRIEF DESCRIPTION OF THE DRAWINGS

FIG. 6a, 6b and 7 are diagrams showing VerilogHDL functional descriptions.

FIG. 8, comprised of 8a–d, shows a function database storage example.

FIG. 9, comprised of 9a–f, shows another function database storage example.

FIG. 12, comprised of 12 a–g, is a descriptive diagram showing the first half of a VerilogHDL functional description for the purpose of explaining the functional data generation process of the present invention, and, FIG. 13, comprised of 13 a–e, shows the second half.

DETAILED DESCRIPTION OF THE INVENTION

Figure 1:
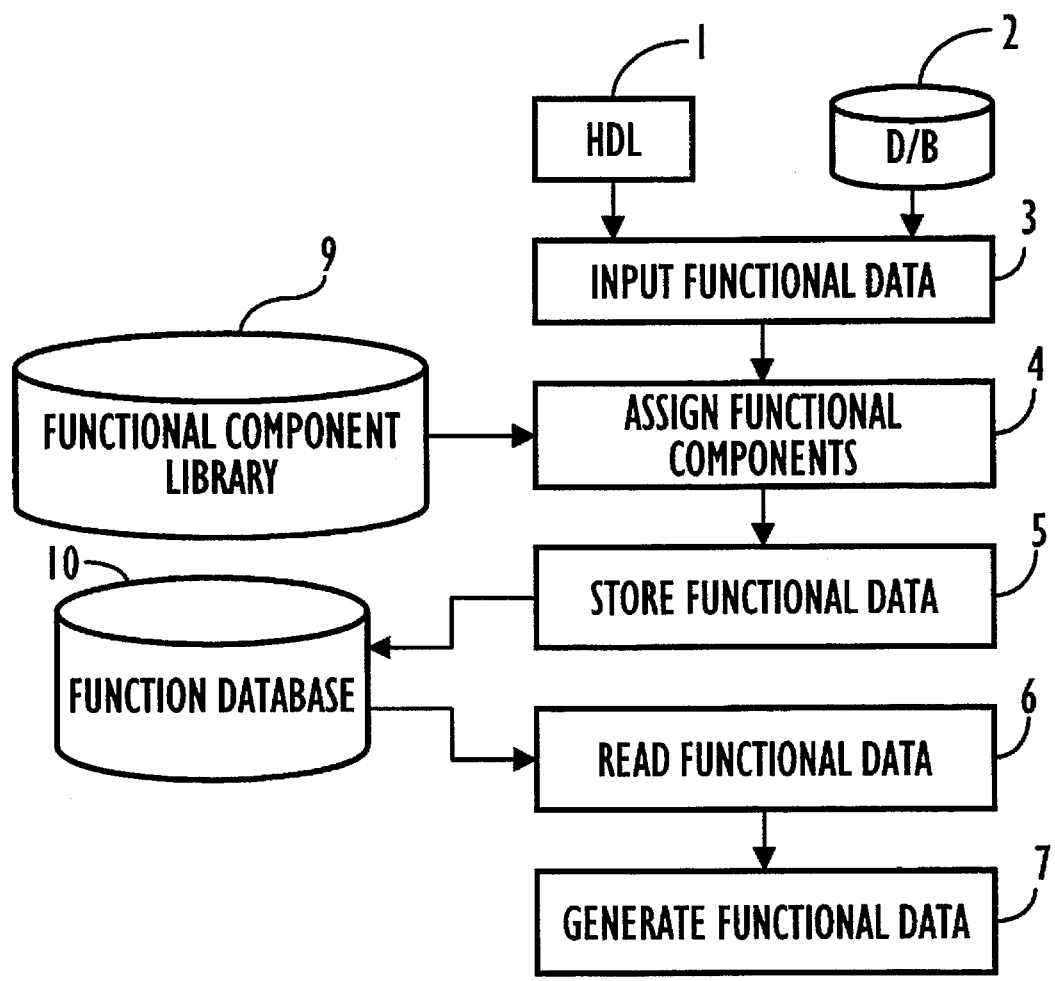
FIG. 1 shows in the form of a flowchart a functional data interface method of the present invention.

FIG. 1 is a flowchart showing a functional data interface method of the present invention.

Shown in FIG. 1 are the following components and processes: an HDL file 1 that is written a functional design by a hardware description language (HDL); a graphic form representation function database 2 represented in functional diagram, state transition diagram, and logical expression representations; a functional data input process 3; a functional component assignment process 4; a functional data storage process 5; a functional data read process 6; a functional data generation process 7; a functional component library 9; and a function database 10.

Figure 2:
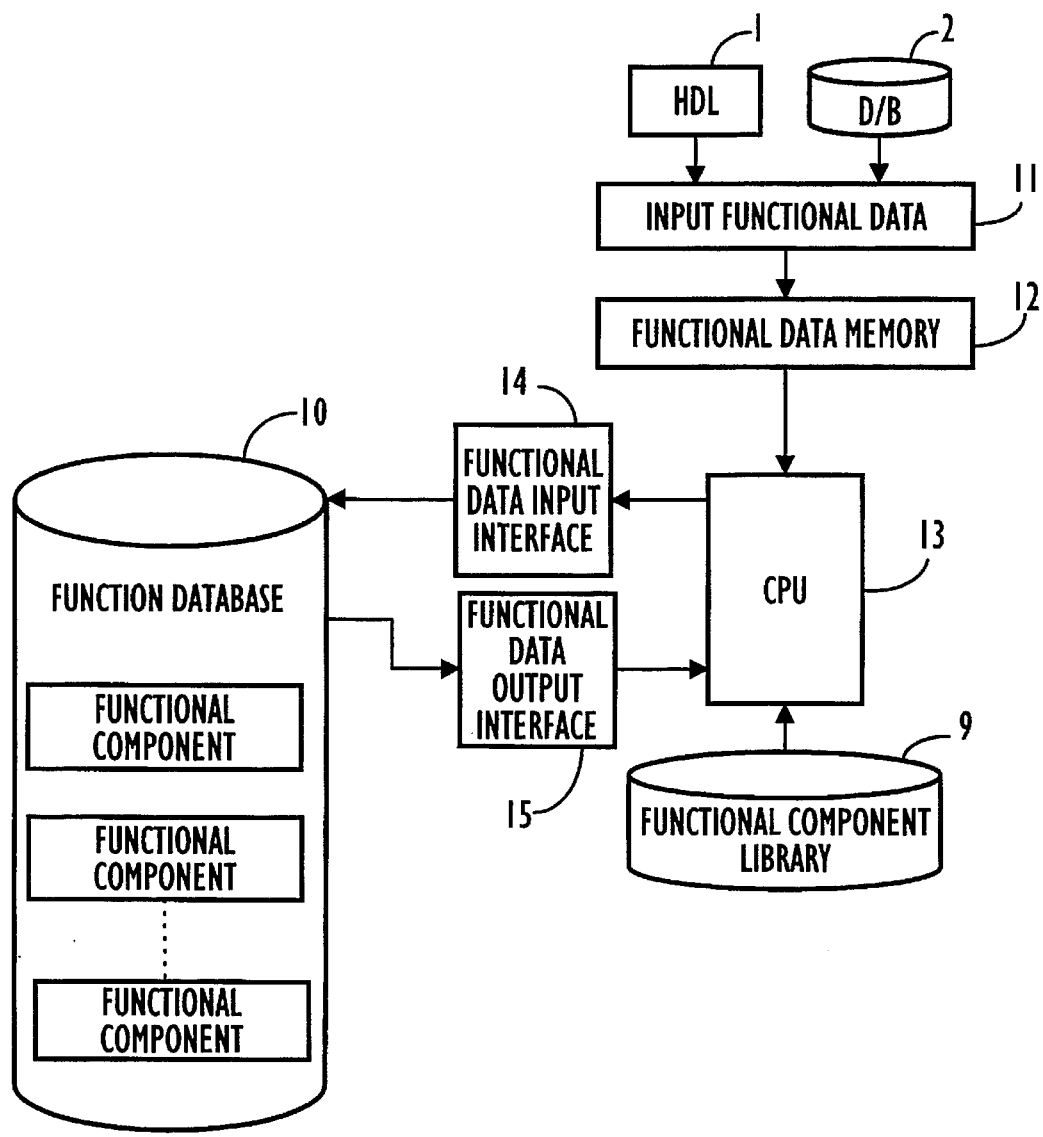
FIG. 2 is a block diagram depicting a functional data interface apparatus of the present invention.

FIG. 2 is a block diagram showing the organization of the present functional data interface apparatus. Shown in FIG. 2 are a functional data input section 11, a functional data memory 12, a central processing unit (CPU) 13 for performing the functional component assignment process 4 and the functional data generation process 7, a functional data input interface 14, and a functional data output interface 15.

Figure 3:
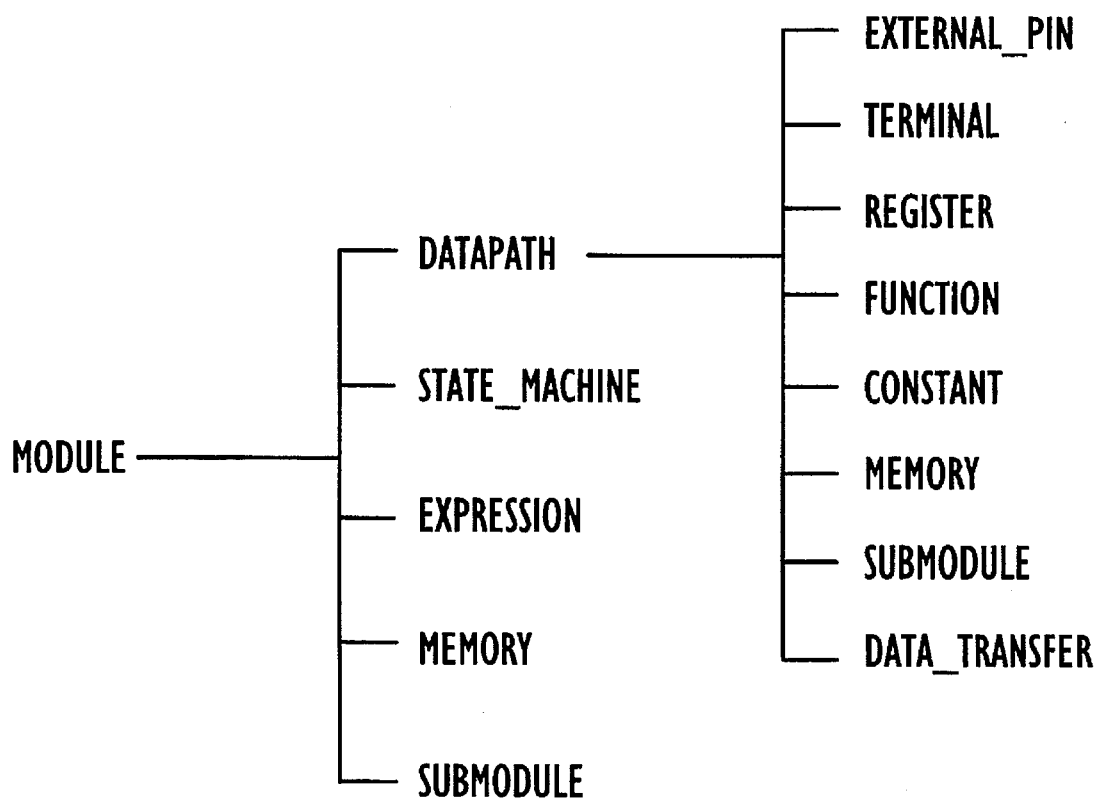
FIG. 3 is a tree-structure diagram illustrating the type of functional component to be stored in a functional component library.

FIG. 3 shows in the form of a tree structure the type of functional component to be stored in the functional component library 9.

MODULE on the left-hand side of FIG. 3 representing the whole functional data indicates either a chip or a functional module in an arbitrary hierarchy. This MODULE branches out into DATA_PATH, STATE_MACHINE, EXPRESSION, MEMORY, and SUBMODULE functional components. DATA_PATH then branches out into these functional components, namely EXTERNAL_PIN, TERMINAL indicative of interconnection components such as buses and multiplexers, REGISTER for storing data, FUNCTION indicative of arithmetic operations or logical operations, CONSTANT, MEMORY, SUBMODULE, and DATA_TRANSFER which is an intervening functional component.

In this tree structure, leaf portions are stored in the functional component library 9 as functional components.

Note that MEMORY and SUBMODULE in a lower hierarchy are equal to MEMORY and SUBMODULE in a higher hierarchy. SUBMODULE can be formed in any hierarchy below MODULE.

Referring now to FIGS. 1 and 2, the processing of the present embodiment is explained.

In the functional data input process 3, the functional data input section 11 inputs either the HDL file 1 or the graphic form representation function database 2. The HDL file 1 or the graphic form representation function database 2, whichever is input, is stored in the functional data memory 12. In the functional data assignment process 4, the stored data records in the functional data memory 12 are assigned by the CPU 13 to the respective functional components of FIG. 3 stored in the functional component library 9. In the functional data storage process 5, the data records classified by functional component are saved in the function database 10 by way of the functional data input interface 14. In the functional data read process 6, the stored functional data records in the function database 10 are forwarded by functional component to the CPU 13 by way of the functional data output interface 15. In the functional data generation process 7, the generation of arbitrary data for functional design automation tools is carried out.

In accordance with the present embodiment, either functional descriptions written by different hardware description languages or functional data created by graphic form input functional design tools are classified into ten types of functional components and can be stored in a common function database. Additionally, data necessary for functional design automation tools can be generated from the function database. As a result of such arrangement, it becomes possible to accomplish the system unification at function level.

Figure 4:
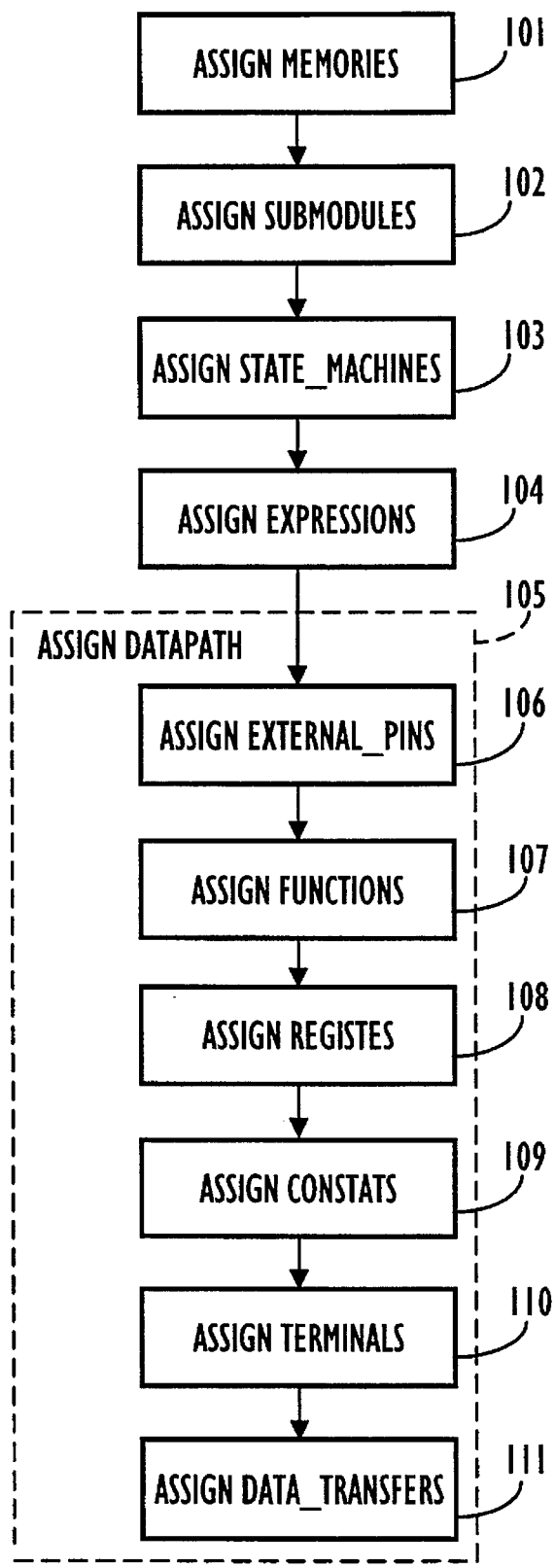
FIG. 4 shows in the form of a flowchart a functional component assignment process of the present invention.

The functional component assignment process 4 is fully described by making reference to FIG. 4.

A memory assignment process 101 is a process for identifying a memory from the functional data memory 12 so as to assign the result of the memory identification operation to MEMORY of the functional component library 9. The submodule assignment process 102 is a process for identifying a submodule from the functional data memory 12 so as to assign the result of the submodule identification operation to SUBMODULE of the functional component library 9. The state machine assignment process 103 is a process for identifying a state machine from the functional data memory 12 so as to assign the result of the state machine identification operation to STATE_MACHINE of the functional component library 9. The logical expression assignment process 104 is a process for identifying a logical expression from the functional data memory 12 so as to assign the result of the logical expression identification operation to EXPRESSION of the functional component library 9.

Further shown in FIG. 4 is a data path assignment process 105 for performing assignment of the remaining functional data stored in the functional data memory 12 to DATA_TRANSFER and to each facility of DATA_PATH. The data path assignment process 105 is made up of six processes described below.

An external pin assignment process 106 is a process for identifying an external pin from the functional data memory 12 so as to assign the result of the external pin identification operation to EXTERNAL_PIN of the functional component library 9. A function assignment process 107 is a process for identifying a function from the functional data memory 12 so as to assign the result of the function identification operation to FUNCTION of the functional component library 9. A register assignment process 108 is a process for identifying a register from the functional data memory 12 so as to assign the result of the register identification operation to REGISTER of the functional component library 9. A constant assignment process 109 is a process for identifying a constant from the functional data memory 12 so as to assign the result of the constant identification operation to CONSTANT of the functional component library 9. A terminal assignment process 110 is a process for identifying a terminal from the functional data memory 12 so as to assign the result of the terminal identification operation to TERMINAL of the functional component library 9. A data transfer assignment process 111 is a process for identifying a data transfer from the functional data memory 12 so as to assign the result of the transfer data identification operation to DATA_TRANSFER of the functional component library 9.

Figure 5:
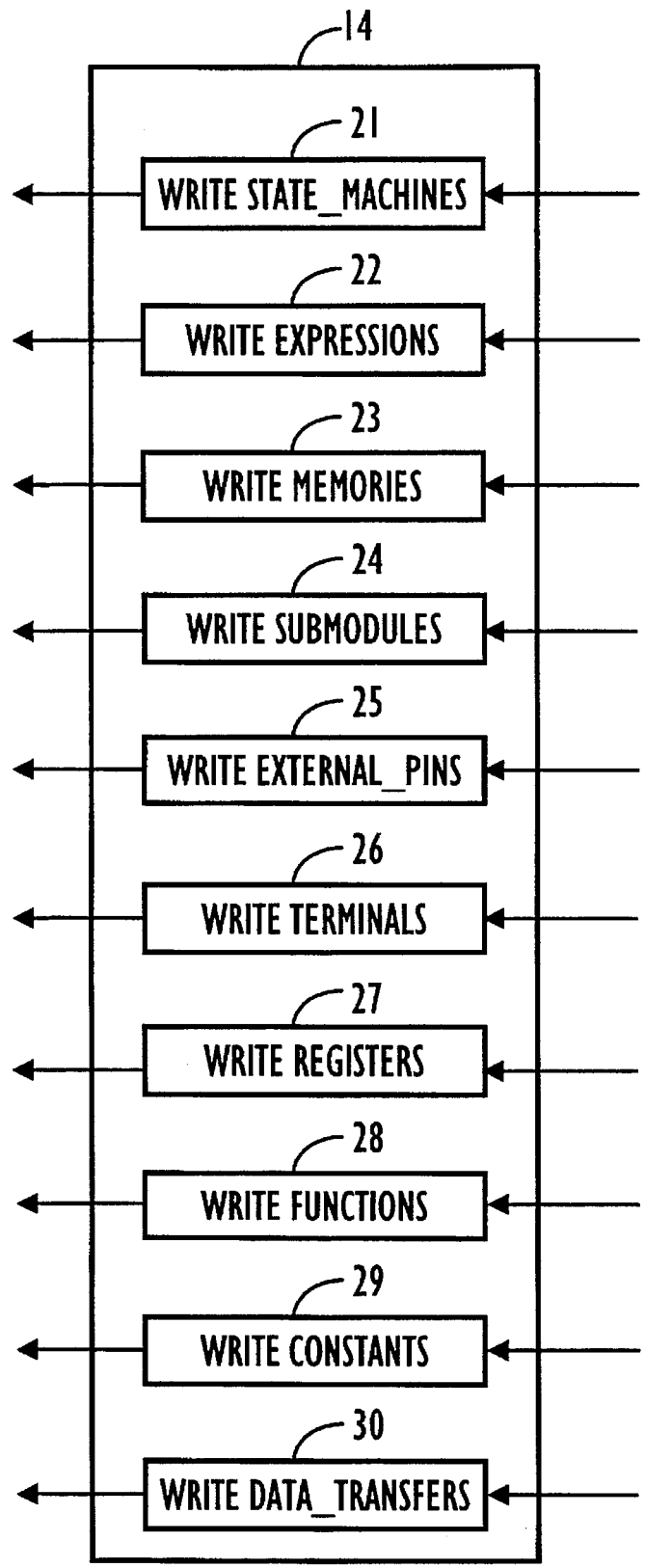
FIG. 5 is a block diagram depicting a functional data input interface of the present invention.

The functional data input interface 14 of the present embodiment is now fully described. FIG. 5 is a block diagram of the functional data input interface 14. FIG. 5 shows a state machine write section 21 for writing the data, assigned to STATE_MACHINE, into the functional database 10, a logical expression write section 22 for writing the data, assigned to EXPRESSION, into the function database 10, a memory write section 23 for writing the data, assigned to MEMORY, into the function database 10, a submodule write section 24 for writing the data, assigned to SUBMODULE, into the function database 10, an external pin write section 25 for writing the data, assigned to EXTERNAL_PIN, into the function database 10, a terminal write section 26 for writing the data, assigned to TERMINAL, into the function database 10, a register write section 27 for writing the data, assigned to REGISTER, into the function database 10, a function write section 28 for writing the data, assigned to FUNCTION, into the function database 10, a constant write section 29 for writing the data, assigned to CONSTANT, into the function database 10, and a data transfer write section 30 for writing the data, assigned to DATA_TRANSFER, into the function database 10.

Next, the functional data storage process 5 of the present embodiment is detailed which is a process for storing the above-described functional design data, assigned to each functional component, into the function database 10 using the following various representation formats.

<expression of STATE_MACHINE>

A STATE_MACHINE is represented using eight types of representation formats. Any one of these representation format types excluding "fsm" is allowed to exist in a number more than or equal to one.

fsm((char)state_machine_name, (int)state_code_length,
(int)number_of_states, (int)number_of_inputs,
(int)number_of_outputs)

Notes:
1. "state_machine_name" is a use name inherently given to STATE_MACHINE.
2. "state_code_length" is a bit width necessary for inherently representing individual states in binary representations.

fsm_clock((char)clock_name, (char)edge_trigger_type)

Note: "edge_trigger_type" is represented by either "rise" or "fall".

fsm_reset((char)reset_name, (char)reset_type,
(char)reset_state_name

Notes:
1. "reset name" is a reset signal name of STATE_MACHINE.
2. "reset_type" is represented by "synchronous" or "asynchronous".
3. "reset state name" is a state name when STATE_MACHINE is reset.

fsm_pin((char)pin_name, (char)io_type, (int)order)

Notes:
1. "pin_name" is a 1-bit input/output signal to STATE_MACHINE.

2. "io_type" is represented by "input" or "output".

---
state_transfer((char)source_state_name,
(char)destination_state_name, (char)input_symbol_name,
(char)output_symbol_name)

---

Note: If values of input signals represented by "input_symbol_name" are realized, there is made a state transition from "source_state_name" to "destination_state_name", and values represented by "output_symbol_name" are provided as output signals. However, either "destination_state_name" and "output_symbol_name" may be left blank.

---
state_code((char)state_name, (int)state_code)

---

Note: "state code" is a numeral representation inherently indicative of states.

---
input_code((char)input_symbol_name, (char)input_code);
output_code((char)output_symbol_name, (char)output_code)

---

Note: "input_code" is a character string indicative of what value an input signal has, whereas "output_code" is a character string indicative of what value an output signal has. "input_symbol_name" is a name rendering "input_code", whereas "output_symbol_name" is a name rendering "output_code". "order" of "fsm_pin" represents the sequential position of characters forming "input_code" or "output_code". For example, in the case of "fsm_pin(A, input, 0)" and "fsm_pin(B, input, 1)", if "input_code" =01, this represents a case where input A=0, and input B=1.

<presentation of EXPRESSION>

---
expression((char)lhs, (char)rhs)

---

Note: "lhs" is a signal name defined by EXPRESSION, whereas "rhs" is a logical expression represented by different signal names.

<presentation of MEMORY>

---
memory((char)instance_name, (char)memory_name,
(int)bit_width, (int)word_width, (char)type, (char)write_enable,
(char)read_enable)

---

Notes:
1. "instance name" is a use inherent name.
2. "memory_name" may be an actually-existing memory name or a virtually-existing memory name.
3. "type" is represented by either a ROM, a RAM, or the like.
4. "write enable" is a write enable signal name, whereas "read enable" is a read enable signal name.
5. If "type" is a ROM, "write_enable" becomes blank.

<presentation of SUBMODULE>

---
sub_module((char)instance_name, (char)submodule_name)

---

Notes:
1. "instance_name" is a use inherent name.
2. "submodule_name" may be either an actually-existing module name or a virtually-existing module name.

<presentation of EXTERNAL_PIN>

---
external_pin((char)pin_name, (int)bit_width, (char)io_type

---

Note: "io_type" is represented by either "input", "output", "bidirection", "clock", "reset", "power", or "ground".

<presentation of TERMINAL>

---
terminal((char)instance_name, (int)bit_width, (char)type)

---

Notes:
1. "instance name" is a use inherent name.
2. "type" is a circuit implementation type represented by "term" in a 1-input case, by "bus" in a bus type case, or by "MUX" in a multiplexer type case.

<presentation of REGISTER>

---
register((char)instance_name, (int)bit_width,
(char)clock_name,
(char)edge_trigger_type, (char)reset_name, (char)reset_type,
(int)reset_value)

---

Notes:
1. "instance_name" is a use inherent name.
2. "edge_trigger_type" is a clock trigger type and is represented by "rise" or "fall".
3. "reset_type" is represented by "synchronous" or "asynchronous".
4. "reset_value" is the value of the reset signal when REGISTER is reset.

<presentation of FUNCTION>

---
function((char)instance_name, (char)function_type,
(int)bit_width)

---

Notes:
1. "instance_name" is a use inherent name.
2. "function_type" is represented by "add", "subtract", "multiplication", "AND", "OR" or the like.

<presentation of CONSTANT>

---
constant ((char)instance_name, (int)bit_width, (int)value)

---

Note: "instance_name" is a use inherent name.

<presentation of DATA_TRANSFER>

---
data_transfer((char)source_instance_name,
(char)source_pin_name,
(char)destination_instance_name, (char)destination_pin_name,
(char)transfer_condition, (int)bit_width)

---

Notes:
1. "source_pin_name". "destination_pin_name", and "transfer_condition" may be left blank.
2. Data transfer takes place only when the value of the signal represented by "transfer_condition" is HIGH.
3. In addition, if each facility of DATA_PATH is assigned "id" as an inherent positive number value and a presentation of DATA_TRANSFER is represented as:

---
data_transfer((int)source_id,
(char)source_pin_name, (int)destination_id,
(char)destination_pin_name,
(char)transfer_condition, (int)bit_width),

--- this reduces the quantity of data.

Referring now to the VerilogHDL functional description of FIGS. 6a, 6b, and 7, the storage of functional data records into the function database 10 is explained. A program shown in FIGS. 6a, and 6b, and 7 is input by the functional data input process 3 from the HDL file 1.

FIG. 8 shows examples as a result of storing in the function database 10 each of the functional data records assigned by the functional component assignment process 4 of FIG. 4 by means of the functional data storage process 5. FIG. 8a shows a MEMORY example. FIG. 8b shows a SUBMODULE example. FIG. 8c shows a STATE_MACHINE example. FIG. 8d shows an EXPRESSION example.

Firstly, the HDL file 1 is read in by the functional data input process 3, thereafter being registered line by line in the functional data memory 12. In other words, the HDL file 1 is registered at the functional data memory 12 in the same format as the one shown in FIGS. 6a and 6b, and 7.

From the 17th line that is a ROM use definition statement, the memory assignment process 101 performs identification of "instance_name", "memory_name", "type", and "write_enable" of MEMORY. From the 106th line (i.e, one of ROM functional descriptions after the 102nd line), "bit_width" and "word_width" are identified. Results of this identification operation are written by the memory write section 23 into the function database 10 in a memory representation format (see FIG. 8a).

From the 18th line that is a SUBMODULE use definition statement, the submodule assignment process 102 performs recognition of "instance_name" and "submodule_name" of SUBMODULE. Results of this identification operation are written by the submodule write section 24 into the function database 10 in a submodule representation format (see FIG. 8b).

The state machine assignment process 103 extracts STATE_MACHINE information, and the extracted STATE_MACHINE information is written by the state machine write section 21 into the function database 10 in a state machine representation format (see FIG. 8c), provided that the name of STATE_MACHINE is defined by a comment statement as shown in the 15th line. This is described below in detail.

<STATE_MACHINE Assignment Process>

(S1): Find "state_machine_name", "state_code_length", "number_of_states", "number_of_inputs", and "number_of_outputs".

(S2): Find "clock" information and "reset" information.

(S3): Find "state_name" and "state_code".

(S4): Find "state_transfer" to determine a symbolic presentation for input and output values.

(S1) can be found from the 15th and the 62–95th lines. (S2) can be found from the 96–99th lines. (S3) can be found from the 13–14th lines. (S4) can be found from case statements from the 71st line on. Respective results of (S1)–(S4) are stored in the function database 10 (i.e., the first line, the second to third lines, the fourth to seventh lines, and the eighth to 23rd lines of FIG. 8c).

After the (S1)–(S4) results are stored in the function database 10, portions in relation to STATE_MACHINE information are deleted from the functional data memory 12.

If the left-hand side ("lhs") of an assignment statement is given a name that is used as a condition of "if", "case", or the like, the logical expression assignment process 104 identifies "lhs" and "rhs" (i.e., the left- and right-hand sides of the assignment statement). The result found is written by the logical expression write section 22 into the function database 10 in a logical expression representation format. In this example, "MODE0" (the 58th line) and "MODE1" (the 59th line) are used in "case" statements from the 44th line onward, so that they are recognized as EXPRESSION (see FIG. 8d).

The data transfer assignment process 105 performs assignment of each facility of DATA_PATH as well as assignment of DATA_TRANSFER.

FIG. 9 shows examples as a result of storing in the function database 10 each of the functional data records assigned by the functional component assignment process 4 of FIG. 4 by means of the functional data storage process 5. FIG. 9a shows an EXTERNAL_PIN example. FIG. 9b shows a TERMINAL example. FIG. 9c shows a REGISTER example. FIG. 9d shows a FUNCTION example. FIG. 9e shows a CONSTANT example. FIG. 9f shows a DATA_TRANSFER example.

The external pin assignment process 106 performs identification of "pin_name", "bit_width" and "io_type" from the second to the fifth lines. Results of the external pin assignment process 106 are written by the external pin write section 25 into the function database 10 in an external pin representation format (see FIG. 9a). Both a pin whose "io_type" is a "clock" type and a pin whose "io_type" is a "reset" type can be judged from, for example, a "posedge" edge trigger representation of the 23rd line as well as from an "if" instruction of the 24th line.

The function assignment process 107 identifies an operator "+" of the 21st line and a compare operator "==" of the 55th line as FUNCTION, thereby founding "function_type" and arbitrarily giving "instance_name". Results of the function assignment process 107 are written by the function write section 28 into the function database 10 in a function representation format (see FIG. 9d).

The register assignment process 108 identifies the left-hand side of an assignment statement, contained within an "always" statement having an edge trigger as shown in the 23rd and 27th lines, as a REGISTER. If "reset" is added thereto, then "reset_name", "reset_type" and "reset_value" are found. Results of the register assignment process 108 are written by the register write section 27 into the function database 10 in a register representation format (see FIG. 9c).

If the edge trigger of "clock" is "posedge", then "edge_trigger_type" is recognized as "rise". If "negedge", then it is recognized as "fall". Additionally, if the reset signal is edge-triggered, then "reset_type" is recognized as "asynchronous". If not edge-triggered, then it is recognized as "synchronous".

The constant assignment process 109 identifies "4'd0" of the 55th line as CONSTANT, arbitrarily gives "instance_name", and finds "bit_width" and "value". Results of the constant assignment process 109 is written by the constant write section 29 into the function database 10 in a constant representation format (see FIG. 9e).

The terminal assignment process 110 identifies the remaining variables (i.e., the variables that have not been assigned to any functional component) as TERMINAL. Results of the terminal assignment process 110 are written by the terminal write section 26 into the function database 10 in a terminal representation format (see FIG. 9b). "type", when there exists only one assignment statement to its variable, is identified as "term". When there exist plural assignment statements thereto and one of them has a substitution of "z", "type" is identified as "bus". In cases other than the above, "type" is identified as "mux". Assignment statements to "BUS" of the 37th to 40th lines contain therein no "z" inputs, so "type" of "BUS" is "mux". On the other hand, there exist "z" inputs in assignment statements to "AIN" of the 45th to 47th lines, so "type" is "bus".

Finally, the data transfer assignment process 111 identifies DATA_TRANSFER among the components assigned to EXTERNAL_PIN, TERMINAL, REGISTER, FUNCTION, CONSTANT, MEMORY, and SUBMODULE. Results of the data transfer assignment process 111 are written by the data transfer write section 30 into the function database 10 in a data transfer representation format (see FIG. 9*f*). This is detailed below.

<ASSIGN DATA_TRANSFER>

(D1): Find the relationship between a pin name and a signal name from a use definition statement of MEMORY or SUBMODULE. Note that no signals indicative of "write_enable" or "read_enable" are taken as DATA_TRANSFER.

(D2): Find DATA_TRANSFER from an "assign" statement.

(D3): Find DATA_TRANSFER from an assignment statement containing a conditional expression with an "if" instruction and a "case" statement. A name used in such a conditional expression serves as a "transfer_ condition" of DATA_TRANSFER. No assignment statements taking a "reset signal" as a conditional expression are taken as DATA_TRANSFER. Additionally, if the left-hand side of an assignment statement is a conditional expression of a different assignment statement, this is not taken as DATA_TRANSFER.

(D4): Find DATA_TRANSFER from an assignment statement whose left-hand side is defined as an EXTERNAL_PIN.

(D5): Find DATA_TRANSFER from an assignment statement whose left-hand side is indicative of "source_instance_name" of another DATA_TRANSFER. For the case of an assignment statement that contains operators for an arithmetic operation, "instance_name" of FUNCTION performing the arithmetic operation is used to create DATA_TRANSFER. If CONSTANT is used, "instance_name" of FUNCTION is replaced by "instance_name" of CONSTANT to create DATA_TRANSFER.

(D1) creates DATA_TRANSFER of the first to fifth lines of FIG. 9*f* from the 17th and 18th lines of FIG. 6. (D2) creates DATA_TRANSFERs of the sixth to seventh lines of FIG. 9*f* from the 21st line of FIG. 6*a* by making use of FUNCTION "func1". (D3) creates DATA_TRANSFERs of the eighth to tenth lines of FIG. 9*f* from the 25th, 29th, and 33rd lines of FIG. 6*a*. (D3) further creates an assignment statement within a "case" statement. (D4) creates DATA_TRANSFER of the 17th to 19th lines of FIG. 9*f* from the 55th line of FIG. 6*b* by making use of FUNCTION "func2". At this stage, "4'd0" is replaced by "const1" created by the constant assignment process 109.

The present invention is described in terms of VerilogHDL. However, other hardware description languages such as VHDL may be useful for assignment processing to functional components. For the case of an HDL capable of making use of commercially available data conversion packages in performing functional data input processing, functional data is stored in a function data store using an internal data structure generated by such a conversion package, and the functional component assignment process performs a functional component assignment process wherein the stored data records are assigned to functional components with such an internal data structure.

If the graphic form representation function database 2, represented by functional diagrams, state transition diagrams and logical expressions, is input, (i) a state transition diagram is assigned to STATE_MACHINE, (ii) a logical expression is assigned to EXPRESSION, (iii) data path facilities from a functional diagram are respectively assigned to EXTERNAL_PIN, TERMINAL, REGISTER, FUNCTION, CONSTANT, MEMORY, and SUBMODULE, and (iv) a data transfer between each component is assigned to DATA_TRANSFER. As a result of such arrangement, assignment processing to the functional component library is facilitated.

Figure 10:
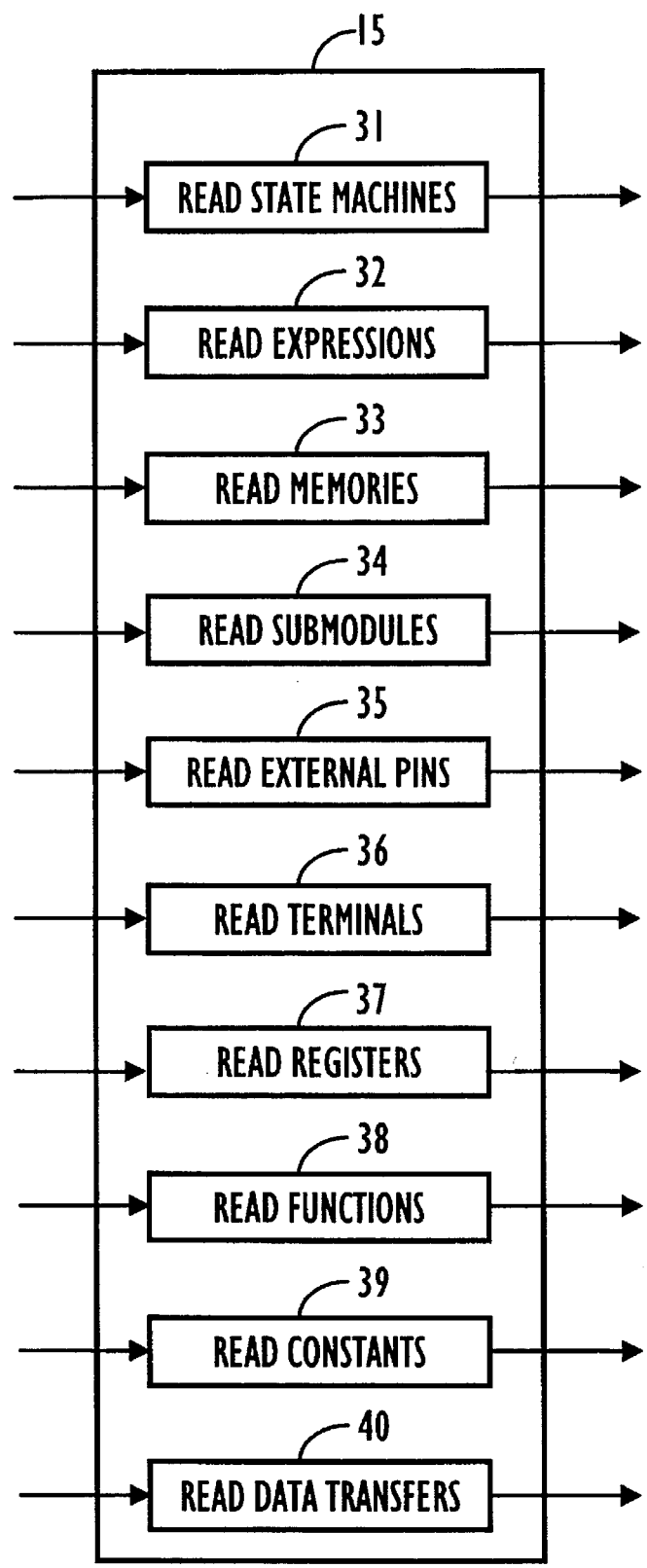
FIG. 10 is a block-diagram depicting a functional data output interface of the present invention.

Referring now to FIG. 10, the functional data output interface 15 is described in detail.

The functional data output interface 15 has a state machine read section 31 for reading STATE_MACHINE data from the function database 10 to the CPU 13, a logical expression read section 32 for reading EXPRESSION data from the function database 10 to the CPU 13, a memory read section 33 for reading MEMORY data from the function database 10 to the CPU 13, a submodule read section 34 for reading SUBMODULE data from the function database 10 to the CPU 13, an external pin read section 35 for reading EXTERNAL_PIN data from the function database 10 to the CPU 13, a terminal read section 36 for reading TERMINAL data from the function database 10 to the CPU 13, a register read section 37 for reading REGISTER data from the function database 10 to the CPU 13, a function read section 38 for reading FUNCTION data from the function database 10 to the CPU 13, a constant read section 39 for reading CONSTANT data from the function database 10 to the CPU 13, and a data transfer relationship read section 40 for reading DATA_TRANSFER data from the function database 10 to the CPU 13.

Figure 11:
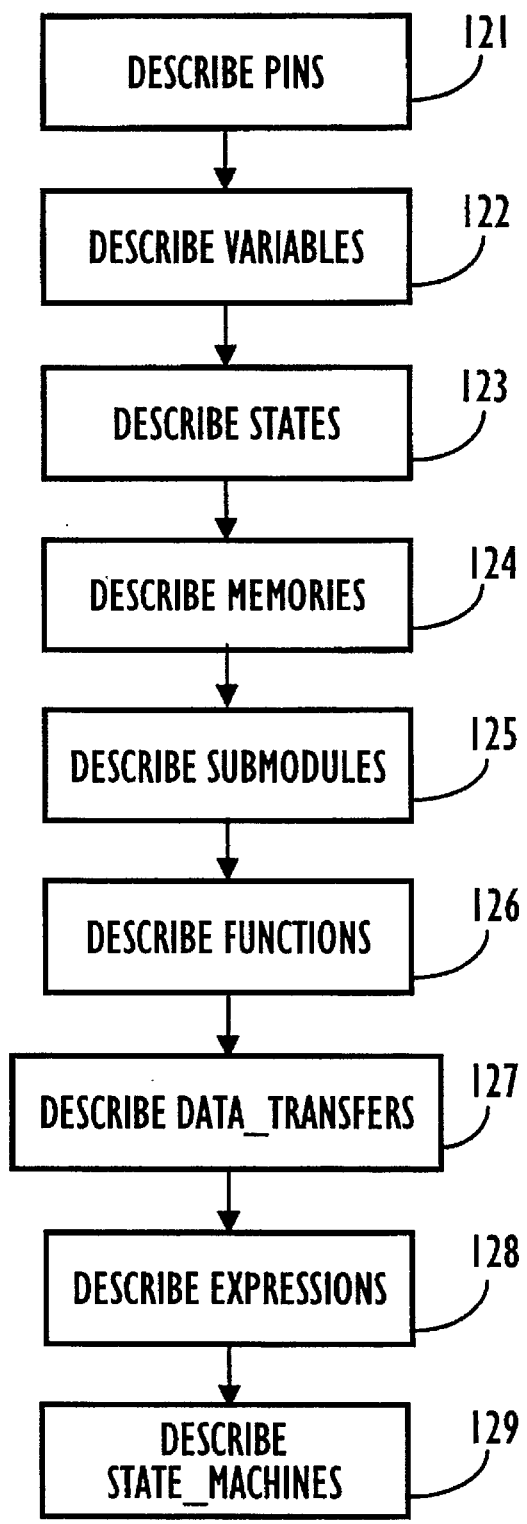
FIG. 11 shows in the form of a flowchart a functional data generation process of the present invention.

The functional data generation process 7 is described in detail by making reference to FIG. 11.

The functional data generation process 7 comprises the following processes: a pin description process 121 to describe module definition statements and external pin definition statements of EXTERNAL_PIN's "io_type", "bit_ width", and "pin_name"; a variable definition description process 122 to describe variable definition statements of the instance names of output EXTERNAL_PIN, TERMINAL, and REGISTER, and EXPRESSION's "lhs" and DATA_ TRANSFER's "transfer_condition"; a state definition description process 123 to describe definition statements of STATE_MACHINE's "state_machine_name", "state_ name", and "state_code"; a memory description process 124 to describe use definitions of MEMORY; a submodule description process 125 to describe use definitions of SUBMODULE; a function description process 126 to describe functions of FUNCTION; a data transfer description process 127 to describe DATA_TRANSFER; a logical expression description process 128 to describe logical expressions contained within EXPRESSION and STATE_MACHINE; and a state machine description process 129 to describe STATE_MACHINE's "state_transfer".

In accordance with the functional data generation process 7, its sub-processes 121–129 independently generate their respective functional descriptions to cope with changes in the language specification and the database specification. Additionally, it is possible to generate descriptions by making use of a different HDL other than the one that is input at the functional data input process. This permits the present invention to be used as an HDL conversion tool.

A VerilogHDL description generation process using the same circuit as the above-described embodiment is explained. Here, it is assumed that both data of FIG. 8 and data of FIG. 9 are stored in the function database 10.

FIGS. 12 and 13 show VerilogHDL description examples by each process of FIG. 11.

FIG. 12*a* shows portions to be described by the pin description process 121 in which the first line makes a module definition statement composed of a MODULE name and EXTERNAL_PIN's "pin_name" and the remaining lines make external pin statements of EXTERNAL_PIN's "bit_width" and "pin_name" by "io_type".

FIG. 12b shows portions to be described by the variable definition description process 122 in which the first and second lines make variable definition statements of EXTERNAL_PIN output pin's "pin_name", the third line is REGISTER's "instance_name", the fourth line is TERMINAL's "instance_name", and the remaining lines are EXPRESSION's "lhs" and DATA_TRANSFER's "transfer_condition" signal names.

FIG. 12c shows portions to be described by the state definition description process 123 in which the first to fifth lines make definition statements of "state_name" and "state_code", the sixth line makes a definition statement of STATE_MACHINE "state_machine_name", and the seventh line makes a definition statement of a variable name having a subsequent state.

FIG. 12d shows portions to be described by the memory description process 124 in which the first line makes a definition statement of a MEMORY's output signal name and the second line makes a use definition statement of MEMORY "ROM".

FIG. 12e shows portions to be described by the submodule description process 125 in which the first line makes a definition statement of a SUBMODULE's output signal name and the second line makes a use definition statement of SUBMODULE "SUBMODULE".

FIG. 12f shows portions to be described by the function description process 126 in which the first line is a FUNCTION's "instance_name" and "bit_width" and the remaining lines are FUNCTION functional descriptions.

FIG. 12g shows portions of a data transfer to EXTERNAL_PIN to be described by the data transfer description process 127 in which the first line is an "always" statement taking a DATA_TRANSFER's "source_instance_name" and "transfer_condition" as "event trigger" and the second line is a DATA_TRANSFER's "if" conditional assignment statement.

FIG. 13a shows portions of DATA_TRANSFER to a "mux" type TERMINAL to be described by the data transfer description process 127. With respect to a DATA_TRANSFER taking the same TERMINAL, their "source_instance_name" and "transfer_condition" are used as "event trigger", and description is performed by a conditional assignment statement of a "case" statement.

FIG. 13b shows portions of DATA_TRANSFER to REGISTER to be described by the data transfer description process 127 in which the first line is an "always" statement, taking "clock" and "reset" as an edge trigger, the second to third liens are reset conditions, and the remaining lines are DATA_TRANSFER to REGISTER.

FIG. 13c shows portions of EXPRESSION to be described by the logical expression description process 128 in which the first and fourth lines are "always" statements, taking variable names contained in EXPRESSION's "rhs" as an event trigger and the second and fifth lines are assignment statements.

FIG. 13d shows portions of a logical expression included in STATE_MACHINE to be described by the logical expression description process 128 in which the first and fourth lines are "always" statements, taking a STATE_MACHINE name as an event trigger and the second and fifth lines are STATE_MACHINE's output signal logical expressions.

FIG. 13e shows portions to be described by the state machine description process 129 in which the first to eighth lines define a subsequent state from the relationship between "source_state_name" and "destination_state_name" of each STATE_MACHINE's "state_transfer", and the ninth to fourteenth lines are descriptions whose states vary with "clock".

The present embodiment makes it possible to generate VerilogHDL descriptions from a functional design by other hardware description languages or by graphics representation input and by performing arbitrary process on functional data of the function database.

The present invention is described in terms of VerilogHDL. However, other hardware description languages such as VHDL may be used to generate descriptions.

In cases where data structures for tools at function level are known, it is possible to generate its data from the function database.

The invention claimed is:

1. A functional data interface method for use in a functional design support apparatus having (i) a function database to store functional information of a logical circuit made up of data paths, state machines logical expressions, memories and submodules; and (ii) a functional component library including memory functional components, submodule functional components, state machine functional components, logical expression functional components and data transfer functional components, said functional data interface method comprising:

a functional data input process step of inputting either a file described in a hardware description language or functional data represented in any of a functional diagram representation, a state transition diagram representation, and a logical expression representation;

a functional component assignment process step of assigning said functional data, read in by said functional data input process step, to a functional component of said functional component library;

a functional data storage process step of separately storing said functional data, assigned by said functional component assignment process step, into said function database by said functional component;

a functional data read process step of separately reading said functional data stored in said function database by said functional component; and a functional data generation process step of generating arbitrary design tool data at a function level from said functional data read by said functional data read process step and assigned by said functional component.

2. The functional data interface method of claim 1, wherein said functional component assignment process step comprises:

a memory assignment process step of identifying a memory from said functional data and assigning a result of the memory identification operation to a memory functional component of said functional component library;

a submodule assignment process step of identifying a submodule indicative of a lower hierarchy from said functional data and assigning a result of the submodule identification operation to a submodule function component of said functional component library;

a state machine assignment process step of identifying a state machine from said functional data and assigning a result of the state machine identification operation to a state machine functional component of said functional component library;

a logical expression assignment process step of identifying a logical expression from said functional data and assigning a result of the logical expression identification operation to a logical expression functional component of said functional component library; and a data path assignment process step of assigning remains of said functional data to a data transfer functional component and to respective facilities thereof.

3. The functional data interface method of claim 2, wherein said functional component library further includes external pin functional components, function functional components, register functional components, constant functional components, and terminal functional components, and wherein said data path assignment process step comprises:

an external pin assignment process step of identifying an input/output (I/O) pin from said functional data and assigning a result of the I/O pin identification operation to an external pin functional component of said functional component library;

a function assignment process step of identifying an arithmetic operation segment and a logical operation segment from said functional data and assigning a result of the arithmetic operation/logical operation segment identification operation to a function functional component of said functional component library;

a register assignment process step of identifying a data hold variable from said functional data and assigning a result of the data store variable identification operation to a register functional component of said functional component library;

a constant assignment process step of identifying a constant from said functional data and assigning a result of the constant identification operation to a constant functional component of said functional component library;

a terminal assignment process step of identifying variables indicative of a multiplexer and a bus from said function data and assigning a result of the variable identification operation to a terminal functional component of said functional component library; and a data transfer assignment process step of identifying a data transfer between each functional component from said functional data and assigning a result of the data transfer identification operation to a data transfer functional component of said functional component library.

4. The functional data interface method of claim 1, wherein said assigned functional data storage process step performs the storage of said functional data into said function database using:

a state machine representation format to represent a state machine by a state machine name, a clock signal name, a clock edge trigger type, a reset signal name, a reset type, a state name, a state code, an input/output signal name, and a state transition;

a logical expression representation format to represent a logical expression by a signal name appearing on a left-hand side of said logical expression and a logical representation appearing on a right-hand side of said logical expression;

a memory representation format to represent a memory by an instance name, a memory name, a bit width, a word width, a memory type, a write enable signal name, and a read enable signal name;

a submodule representation format to represent a submodule by an instance name and a submodule name;

an external pin representation format to represent an external pin by a pin name, a bit width, and an input/output type;

a terminal representation format to represent a terminal by an instance name, a bit width, and a circuit implementation type;

a register representation format to represent a register by an instance name, a bit width, a clock signal name, a clock edge trigger type, a reset signal name, a reset type, and a reset signal value, a function representation format to represent a function by an instance name, a function type, and a bit width;

a constant representation format to represent a constant by an instance name, a bit width, and a value; and a data transfer representation format to represent a data transfer by a beginning component's instance name and pin name, an end component's instance name and pin name, a transfer condition, and a data bit width.

5. The functional data interface method of claim 1, wherein said functional data generation process step comprises:

a pin description process step of describing a module definition statement and an external pin definition statement;

a variable definition description process step of describing variable definition statements of an output pin, a terminal, a register, a logical expression left-hand side, a data transfer relationship condition;

a state definition description process step of describing definition statements of a state machine name, a state name, and a state code;

a memory description process step of describing a memory use definition;

a submodule description process step of describing a submodule use definition;

a function definition description process step of describing a function definition statement;

a data transfer description process step of describing a data transfer;

a logical expression description process step of describing a logical expression and a logical expression contained in a state machine; and a state machine description process step of describing a statement machine state transition.

6. A functional data interface apparatus for use in a functional design support apparatus having (i) a function database to store functional information of a logical circuit made up of data paths, state machines, logical expressions, memories and submodules; and (ii) a functional component library including memory functional components, submodule functional components, state machine functional components, logical expression functional components and data transfer functional components, said functional data interface apparatus comprising:

a functional data input section for inputting either a file described in a hardware description language or functional data represented in any of a functional diagram representation, a state transition diagram representation, and a logical expression representation;

a functional data memory for storing said functional data read in by said functional data input section;

a central processing unit (CPU) for assigning said functional data stored into said functional data memory to functional components of said functional library and generating arbitrary design tool data at a function level from said functional data assigned to said functional components;

a functional data input interface for moving said functional data assigned by said CPU by functional component to said function database; and a functional data output interface for moving said functional data from said function database to said CPU by functional component.

* * * * *